(12) United States Patent
Kim et al.

(10) Patent No.: US 12,495,560 B2
(45) Date of Patent: Dec. 9, 2025

(54) SEMICONDUCTOR DEVICE

(71) Applicant: PICO SEMICONDUCTOR INC., Suwon-si (KR)

(72) Inventors: Yong Kuk Kim, Suwon-si (KR); Ki Ju Baek, Suwon-si (KR)

(73) Assignee: PICO SEMICONDUCTOR INC., Suwon-si (KR)

( * ) Notice: Subject to any disclaimer, the term of this patent is extended or adjusted under 35 U.S.C. 154(b) by 359 days.

(21) Appl. No.: 18/356,239

(22) Filed: Jul. 21, 2023

(65) Prior Publication Data

US 2024/0405062 A1 Dec. 5, 2024

(30) Foreign Application Priority Data

May 30, 2023 (KR) ........................ 10-2023-0069130

(51) Int. Cl.
*H10D 1/68* (2025.01)
*H10D 1/00* (2025.01)
(Continued)

(52) U.S. Cl.
CPC ............. *H10D 1/716* (2025.01); *H10D 1/042* (2025.01); *H10D 1/665* (2025.01); *H10D 1/696* (2025.01); *H10D 84/212* (2025.01)

(58) Field of Classification Search
CPC ........ H10D 1/716; H10D 1/714; H10D 1/696; H10D 1/043; H10D 1/042; H10B 12/038;
(Continued)

(56) References Cited

U.S. PATENT DOCUMENTS 11,063,157 B1 * 7/2021 Cheng ................... H10D 1/043
2012/0146182 A1 6/2012 Oganesian et al.
(Continued)

FOREIGN PATENT DOCUMENTS

CN 113130449 A 12/2022
DE 102019118369 A1 6/2020
(Continued)

OTHER PUBLICATIONS

European Search Report from the European Patent Office dated Jan. 31, 2024 from European Patent Application No. 23188297.8.
(Continued)

*Primary Examiner* — Jose R Diaz
(74) *Attorney, Agent, or Firm* — AJU IP Global PLLC

(57) ABSTRACT

Disclosed herein is a semiconductor device including first and second capacitor structures formed to be spaced apart from each other on a semiconductor substrate, wherein the first capacitor structure includes a first trench formed in the semiconductor substrate, first, second, and third electrode layers disposed in the first trench, and first, second, and third dielectric layers disposed in an interlaced structure with the semiconductor substrate and the first to third electrode layers, the second capacitor structure includes a second trench formed in the semiconductor substrate, fourth, fifth, and sixth electrode layers disposed in the first trench, and fourth, fifth, and sixth dielectric layers disposed in an interlaced structure with the semiconductor substrate and the fourth to sixth electrode layers, and a connection blocking area formed between the first and second capacitor structures to block connections between elements constituting the first capacitor structure and elements constituting the second capacitor structure.

14 Claims, 12 Drawing Sheets

(51) Int. Cl.
*H10D 1/66* (2025.01)
*H10D 84/00* (2025.01)

(58) Field of Classification Search
CPC .. H10B 12/37; H10B 12/0387; H01L 23/5223
See application file for complete search history.

(56) References Cited

U.S. PATENT DOCUMENTS

| | | |
|---|---|---|
| 2019/0245031 A1 | 8/2019 | Lin et al. |
| 2020/0176552 A1* | 6/2020 | Chang .................... H10D 1/665 |
| 2021/0202761 A1 | 7/2021 | Cheng et al. |
| 2024/0047513 A1* | 2/2024 | Su ........................ H01L 23/642 |

FOREIGN PATENT DOCUMENTS

| | | |
|---|---|---|
| JP | 2022021336 A | 2/2022 |
| KR | 10-2005-0054637 A | 6/2005 |
| TW | 202315143 A | 4/2023 |
| WO | 2011090440 A1 | 7/2011 |

OTHER PUBLICATIONS

Extended European Search Report dated May 2, 2024 in European Patent Application No. 23188297.8.
Office Action dated Jun. 21, 2024 in Taiwanese Patent Application No. 112127861.
Office Action dated Aug. 6, 2024 in Japanese Patent Application No. 2023-123065.

* cited by examiner

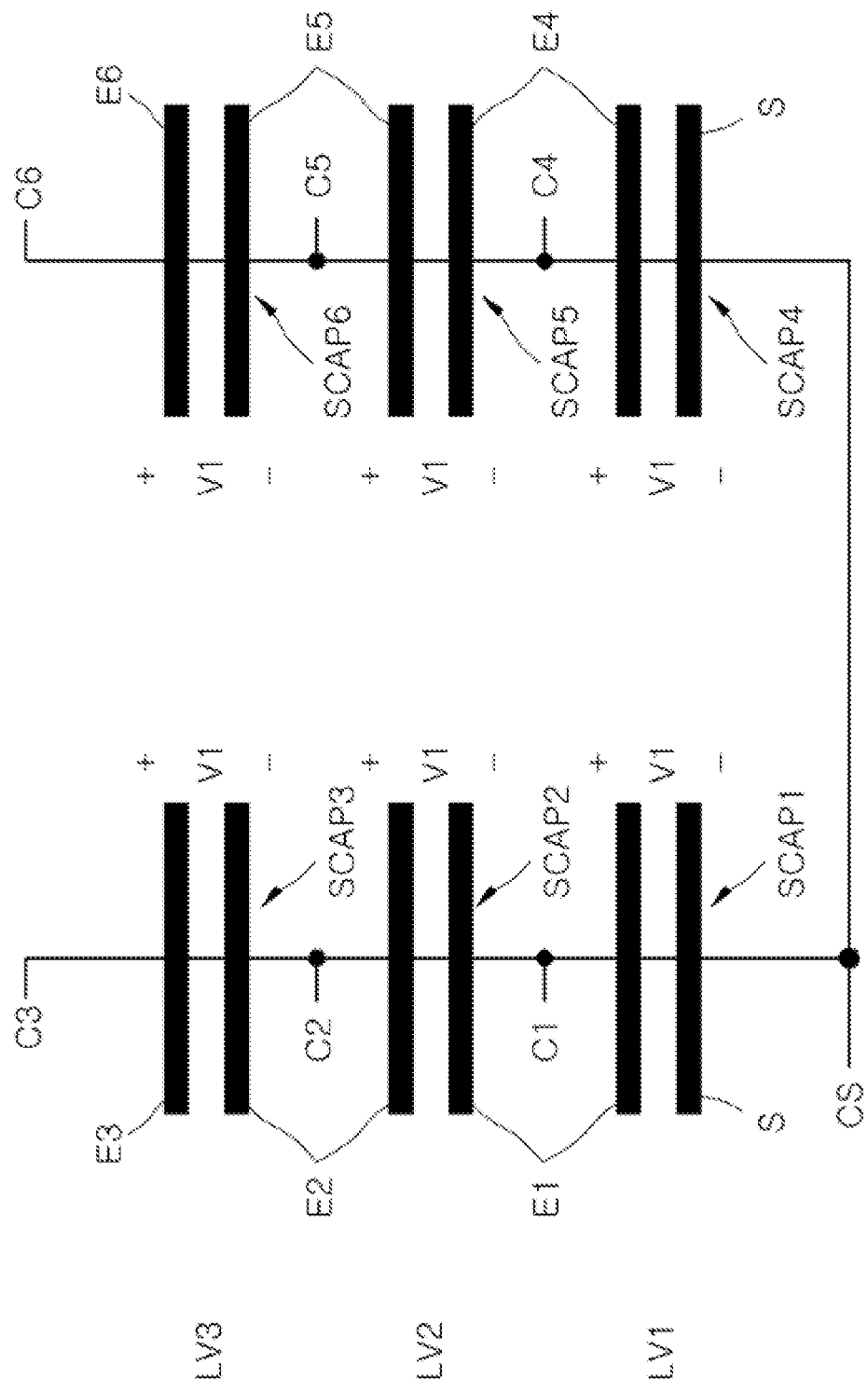

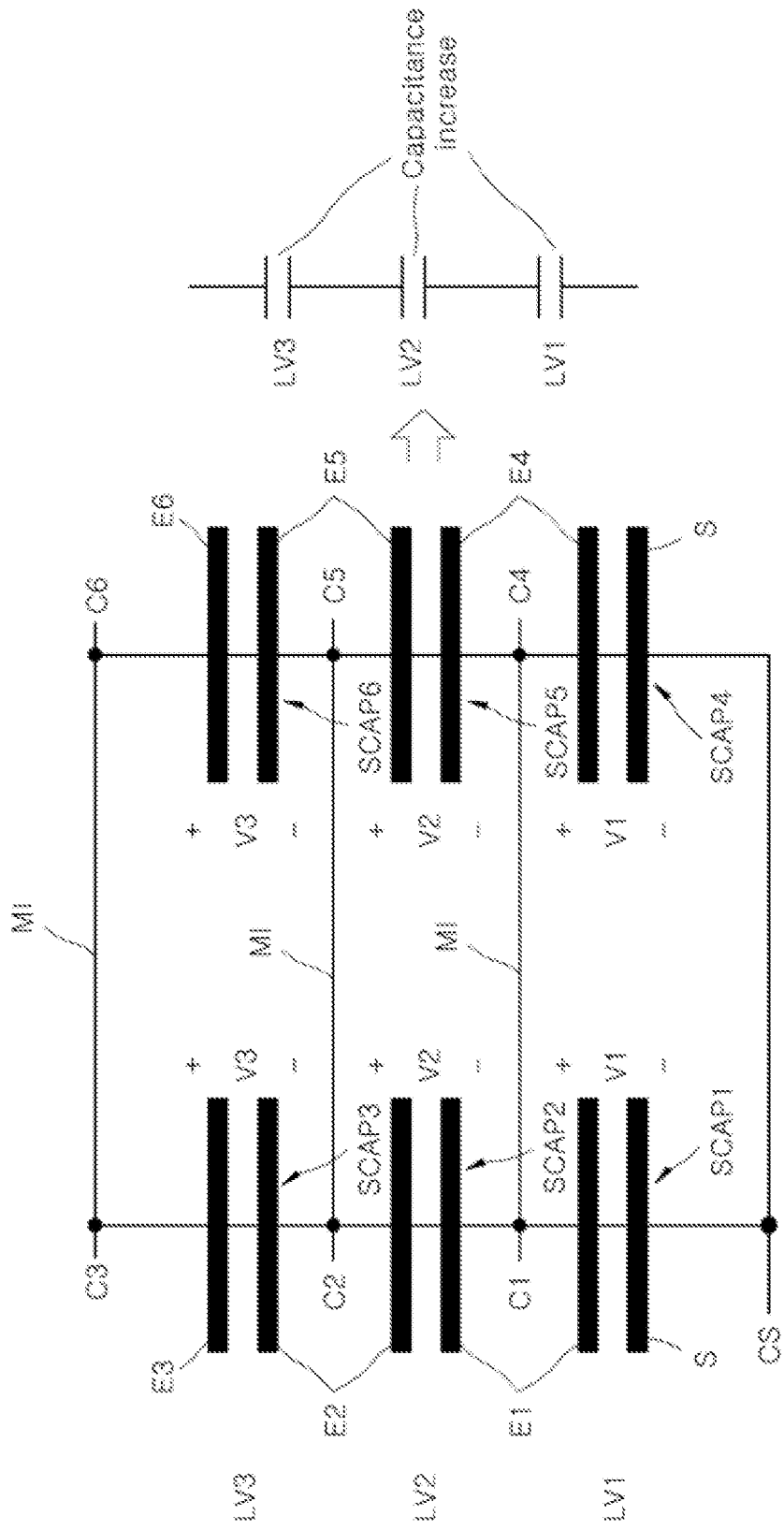

SEMICONDUCTOR DEVICE

CROSS-REFERENCE TO RELATED APPLICATION

This application claims priority to and the benefit of Korean Patent Application No. 10-2023-0069130, filed on May 30, 2023, the disclosure of which is incorporated herein by reference in its entirety.

BACKGROUND

1. Field of the Invention

The present invention relates to a semiconductor device, and more particularly, to a semiconductor device having a trench capacitor.

2. Discussion of Related Art

Integrated circuit (IC) integration of large-capacity capacitors applied as bypass capacitors or decoupling capacitors is an important task. As part of implementing large-capacity capacitors, along with the increasing demand for multi-layer ceramic capacitors (MLCCs) and single layer capacitors (SLCs), research and development is consistently progressing on trench capacitors which are superior in power storage performance and reliability compared to the MLCCs and SLCs and enable integration.

Trench capacitors have the advantage of securing sufficient capacitance without an aspect ratio problem compared to stacked capacitors in that capacitors are implemented through trenches formed on semiconductor substrates, and thus recently, the trench capacitors capable of securing sufficient capacitance without the aspect ratio problem have been mainly used.

The related art of the present invention is disclosed in Korean Patent Laid-Open Application No. 10-2005-0054637 (published on Jun. 10, 2005).

SUMMARY OF THE INVENTION

The present invention is directed to providing a semiconductor device (for example, an integrated circuit (IC)) having a plurality of trench capacitors, in which the usability of trench capacitors may be expanded and sticking problems, warpage problems, and substrate crack problems, which may be caused by stress applied to semiconductor substrates in a trench capacitor processing process, may be removed.

According to an aspect of the present invention, there is provided a semiconductor device including first and second capacitor structures formed to be spaced apart from each other on a semiconductor substrate, wherein the first capacitor structure includes a first trench formed in the semiconductor substrate, first, second, and third electrode layers disposed in the first trench, and first, second, and third dielectric layers disposed in an interlaced structure with the semiconductor substrate and the first to third electrode layers, the second capacitor structure includes a second trench formed in the semiconductor substrate, fourth, fifth, and sixth electrode layers disposed in the first trench, and fourth, fifth, and sixth dielectric layers disposed in an interlaced structure with the semiconductor substrate and the fourth to sixth electrode layers, and a connection blocking area in which connections between elements constituting the first capacitor structure and elements constituting the second capacitor structure are blocked is formed between the first and second capacitor structures.

Corresponding elements among the elements constituting the first capacitor structure and the elements constituting the second capacitor structure may be formed through the same semiconductor in features of process.

The semiconductor substrate, the first dielectric layer, and the first electrode layer may constitute a first sub-capacitor structure of the first capacitor structure, the first electrode layer, the second dielectric layer, and the second electrode layer may constitute a second sub-capacitor structure of the first capacitor structure, and the second electrode layer, the third dielectric layer, and the third electrode layer may constitute a third sub-capacitor structure of the first capacitor structure, the semiconductor substrate, the fourth dielectric layer, and the fourth electrode layer may constitute a fourth sub-capacitor structure of the second capacitor structure, the fourth electrode layer, the fifth dielectric layer, and the fifth electrode layer may constitute a fifth sub-capacitor structure of the second capacitor structure, and the fifth electrode layer, the sixth dielectric layer, and the sixth electrode layer may constitute a sixth sub-capacitor structure of the second capacitor structure, and the semiconductor device may further include an interconnection structure connected to the semiconductor substrate and the first to sixth electrode layers in order to provide parallel connections between a plurality of sub-capacitor structures selected from among the first to sixth sub-capacitor structures or allow each sub-capacitor structure to serve as a single capacitor.

The interconnection structure may include a contact-metal structure configured to provide a parallel connection between the first and fourth sub-capacitor structures, a parallel connection between the second and fifth sub-capacitor structures, and a parallel connection between the third and sixth sub-capacitor structures.

The interconnection structure may include a contact-metal structure configured to provide parallel connections between N sub-capacitor structures selected from among the first to sixth sub-capacitor structures and allow each of the remaining M sub-capacitor structures to serve as a single capacitor.

Each of the first to sixth dielectric layers may have a thickness profile corresponding to a predefined voltage profile according to a voltage applied to each of the first to sixth sub-capacitor structures so that a plurality of voltages with different voltage values may be applied to the first and second capacitor structures.

The semiconductor substrate itself may be highly doped to form a common ground electrode for the first and second capacitor of structures.

The first trench may have a first length, and the second trench may have a second length that is greater than the first length based on a first direction on the semiconductor substrate.

The first and second trenches may be alternately disposed in at least one portion of the semiconductor substrate based on the first direction or a second direction so that an arrangement structure of the first and second trenches in the semiconductor substrate may have irregularity.

The semiconductor device may include a first trench module, wherein the first trench module may include the second trench and the first trench disposed at each of two sides of the second trench based on a second direction perpendicular to the first direction.

The semiconductor device may include a second trench module, wherein the second trench module may include the first trench and the second trench disposed at each of two sides of the first trench based on a second direction.

The first trench module and the second trench module may be disposed adjacent to each other in the second direction, and when the adjacently disposed first trench module and second trench module are defined as a complex trench module, the first trench module may be additionally disposed on one side of the complex trench module based on the first direction or the second direction, and a length direction of the additionally disposed first trench module may be the second direction.

A semiconductor device includes a first mesh structure and a second mesh structure which are partitioned by a trench formed in a semiconductor substrate, wherein a plurality of electrode layers and one or more dielectric layers disposed in an interlaced structure with the semiconductor substrate and the plurality of electrode layers are disposed in the trench, and the first and second mesh structures include, at least partially, tapered portions, each having a width which becomes smaller toward lower portions of the first and second mesh structures.

A void for stress relief with a width profile corresponding to the tapered portion may be formed in the trench in which the plurality of electrode layers and the one or more dielectric layers are stacked.

The void may be a free space formed by being closed by only an outermost electrode layer among the plurality of electrode layers disposed in the trench.

The outermost electrode layer may be disposed along a bottom surface, a first sidewall, and a second sidewall of the trench, and the outermost electrode layer disposed along the first sidewall and the outermost electrode layer disposed along the second sidewall may be brought into contact with each other at an upper side of the tapered portion due to the tapered portion, and thus an upper opening of the trench may be closed to form the void.

The void may be formed independently from an interlayer dielectric (ILD) applied to the semiconductor device by portions of the outermost electrode layers in contact with each other at the upper side of the tapered portion.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 3A to FIG. 3F show circuit diagrams illustrating connections of sub-capacitor structures according to an implementation method of an interconnection structure in the semiconductor device according to an embodiment;

DETAILED DESCRIPTION OF EXEMPLARY EMBODIMENTS

Figure 1:
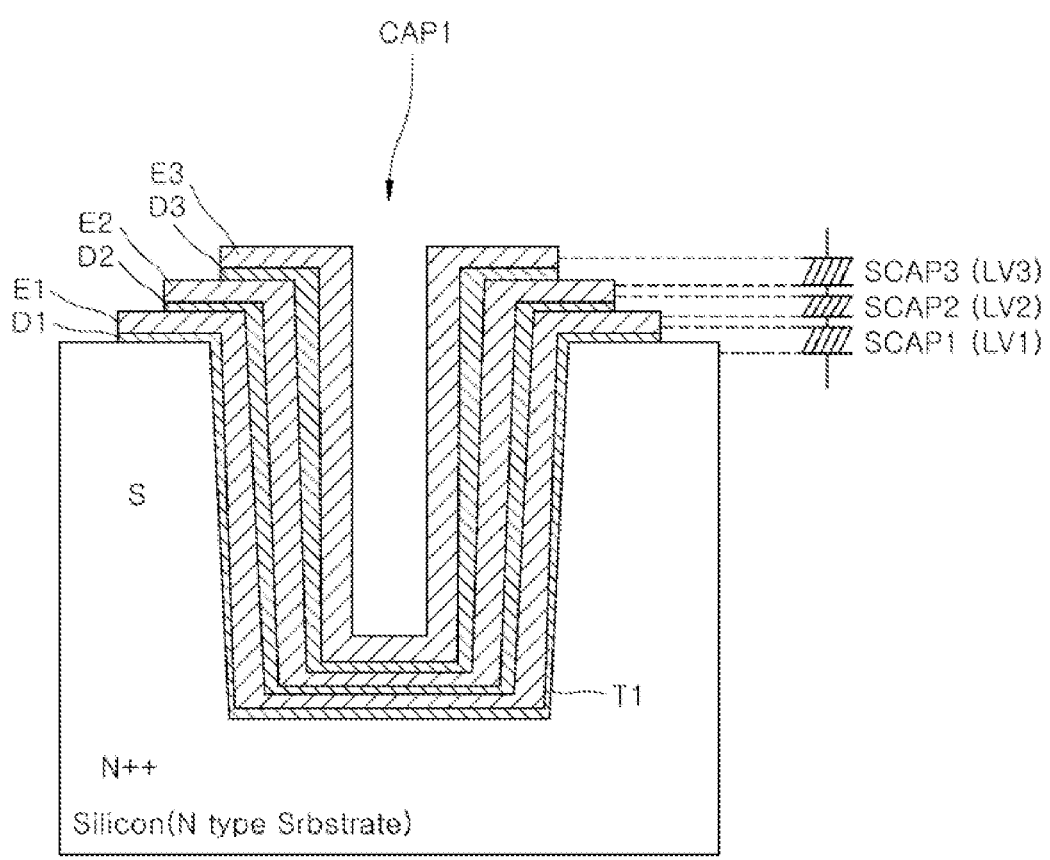
FIG. 1 is a cross-sectional view illustrating a capacitor structure in a semiconductor device according to an embodiment.

Hereinafter, a semiconductor device according to the present invention will be described with reference to the accompanying drawings. In the following description, thicknesses of lines and sizes of components shown in the drawings may be exaggerated for clarity and convenience of explanation. In addition, the terms described below are defined in consideration of the functions of the present invention, and these terms may be varied according to the intent or custom of a user or an operator. Therefore, these terms should be defined on the basis of the contents throughout the present specification.

In the present specification, when one portion of a layer, a film, a region, a plate, or the like is referred to as being "on" the other portion, this includes not only a case in which the one portion is "directly on" the other portion but also a case in which other portions are present between the one portion and the other portion. Conversely, when one portion is "directly on" the other portion, there is no other portion between the one portion and the other portion. In addition, a portion being "above" or "on" a reference portion means the portion being located above or below the reference portion, and does not necessarily mean that the portion is located "above" or "on" in a direction opposite to gravity.

In addition, throughout the present specification, when a part is referred to as "including" a component, this means that the part can include other elements, rather than excluding any other components unless specifically stated otherwise.

In addition, throughout the present specification, a view referred to as a "plan view" shows a target part from above, and a view referred to as a "cross-sectional view" shows a cross section of the target part cut vertically from the side.

In addition, throughout the present specification, "connected" does not necessarily mean that two or more components are directly connected, but may also mean that two or more components are indirectly connected through another component, are physically or electrically connected, or are referred to by different names according to a location or function but are integrated.

In addition, although the terms "first," "second," and the like are used to describe various components, these components are not substantially limited by these terms. The terms may only be used to distinguish one component from another component. Therefore, a first component described below may be substantially a second component within the technical spirit of the present invention.

Figure 2:
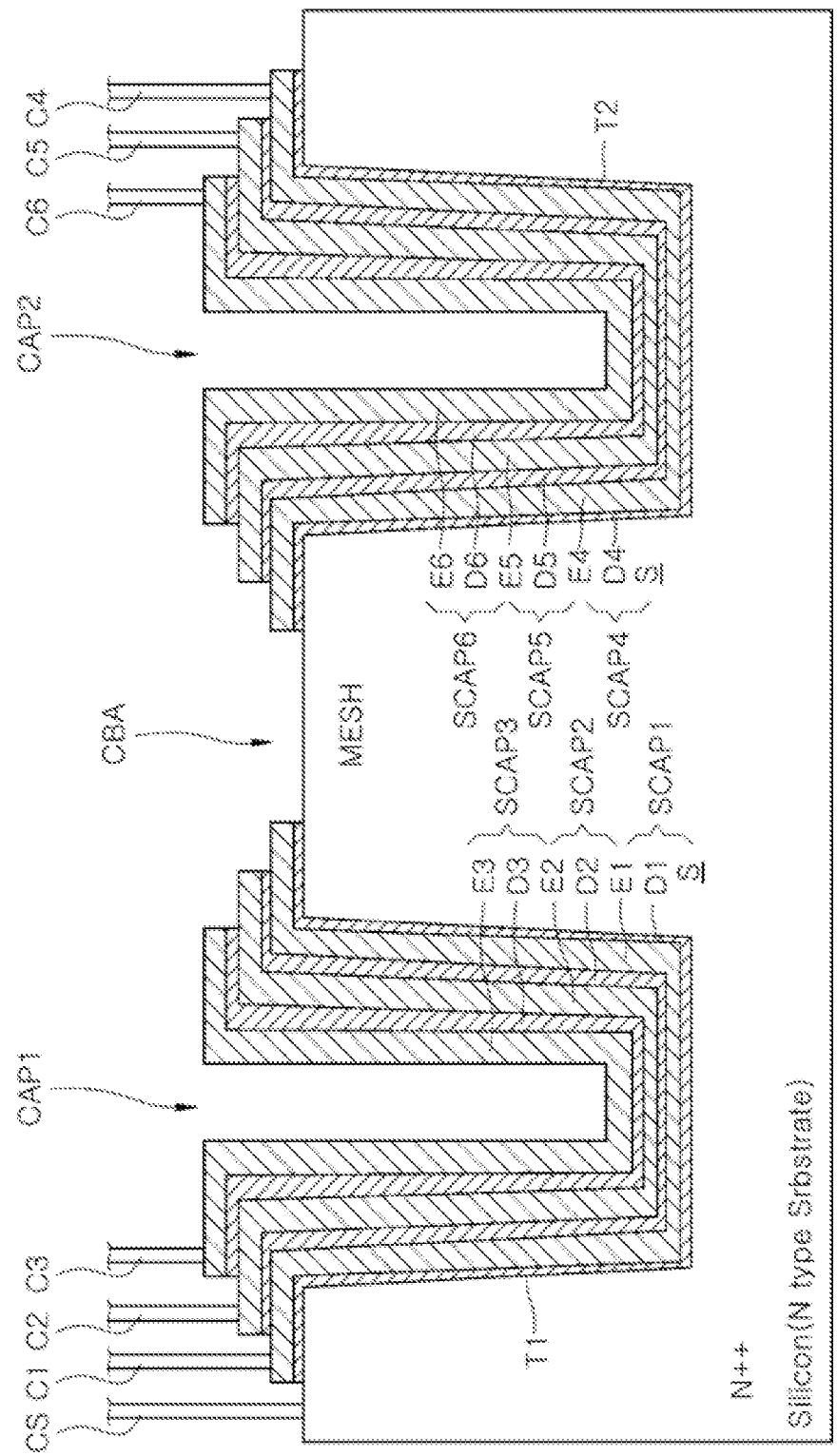
FIG. 2 is a cross-sectional view illustrating first and second capacitor structures in the semiconductor device according to an embodiment.
Figure 3B:
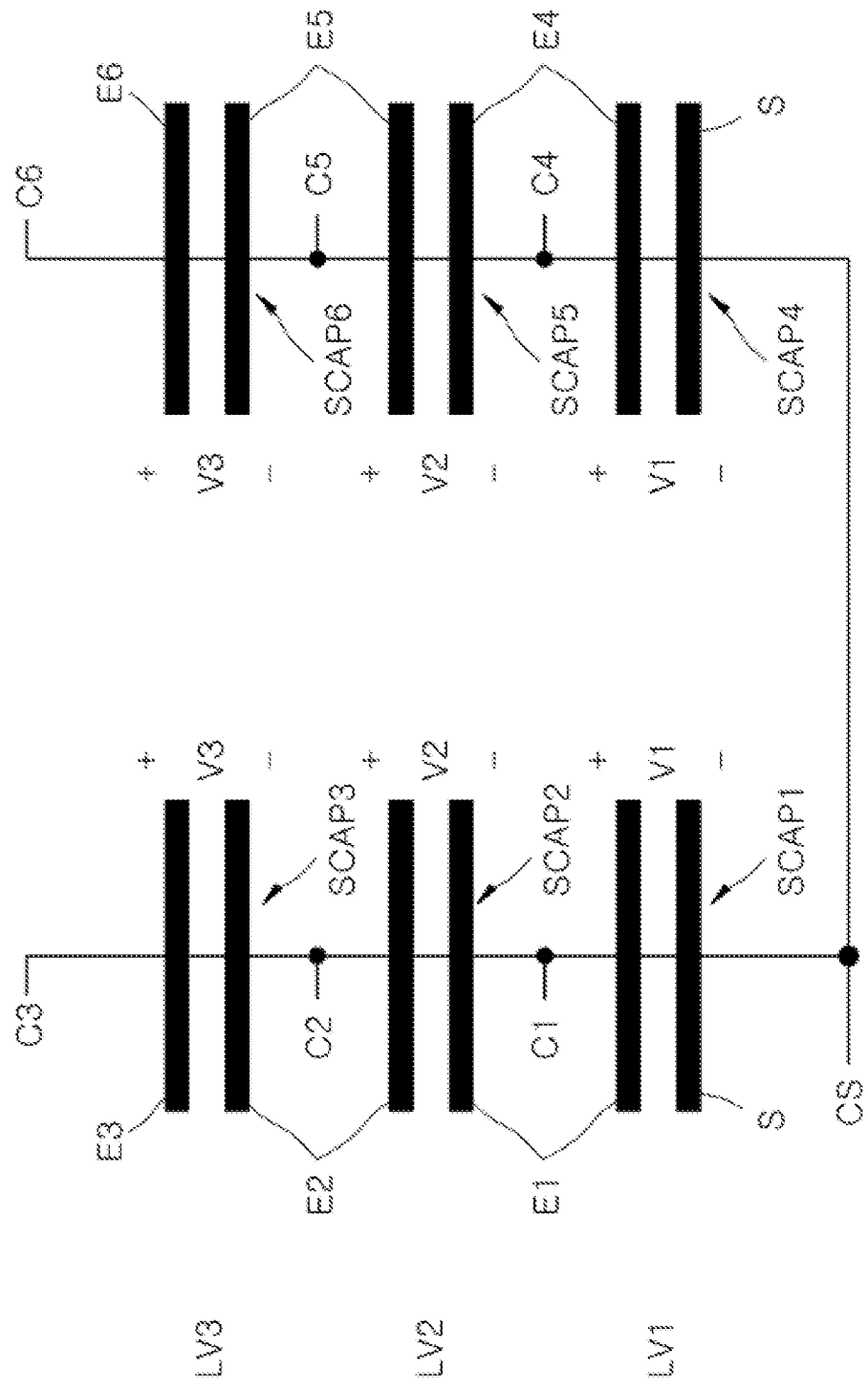
Figure 3C:
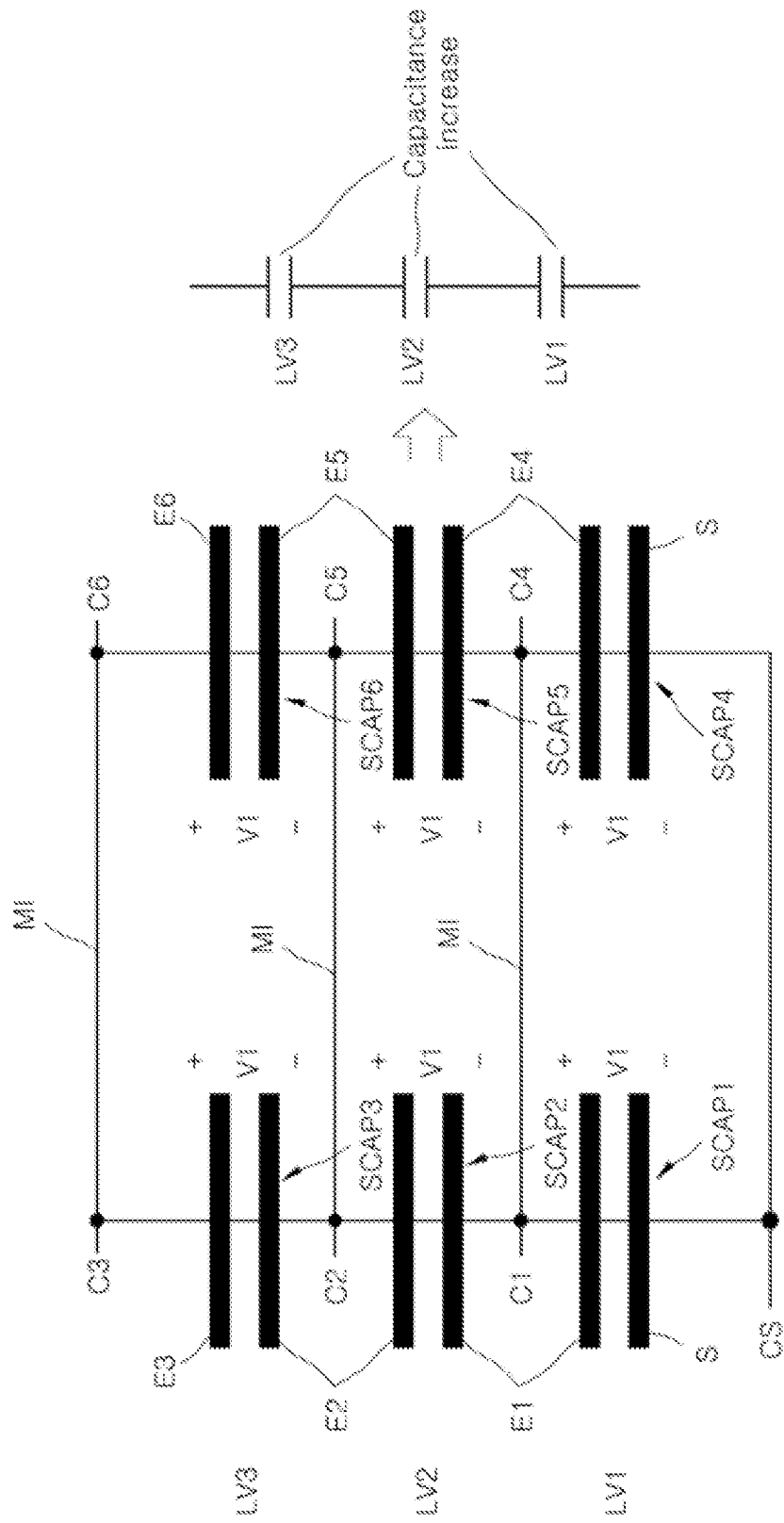
Figure 3E:
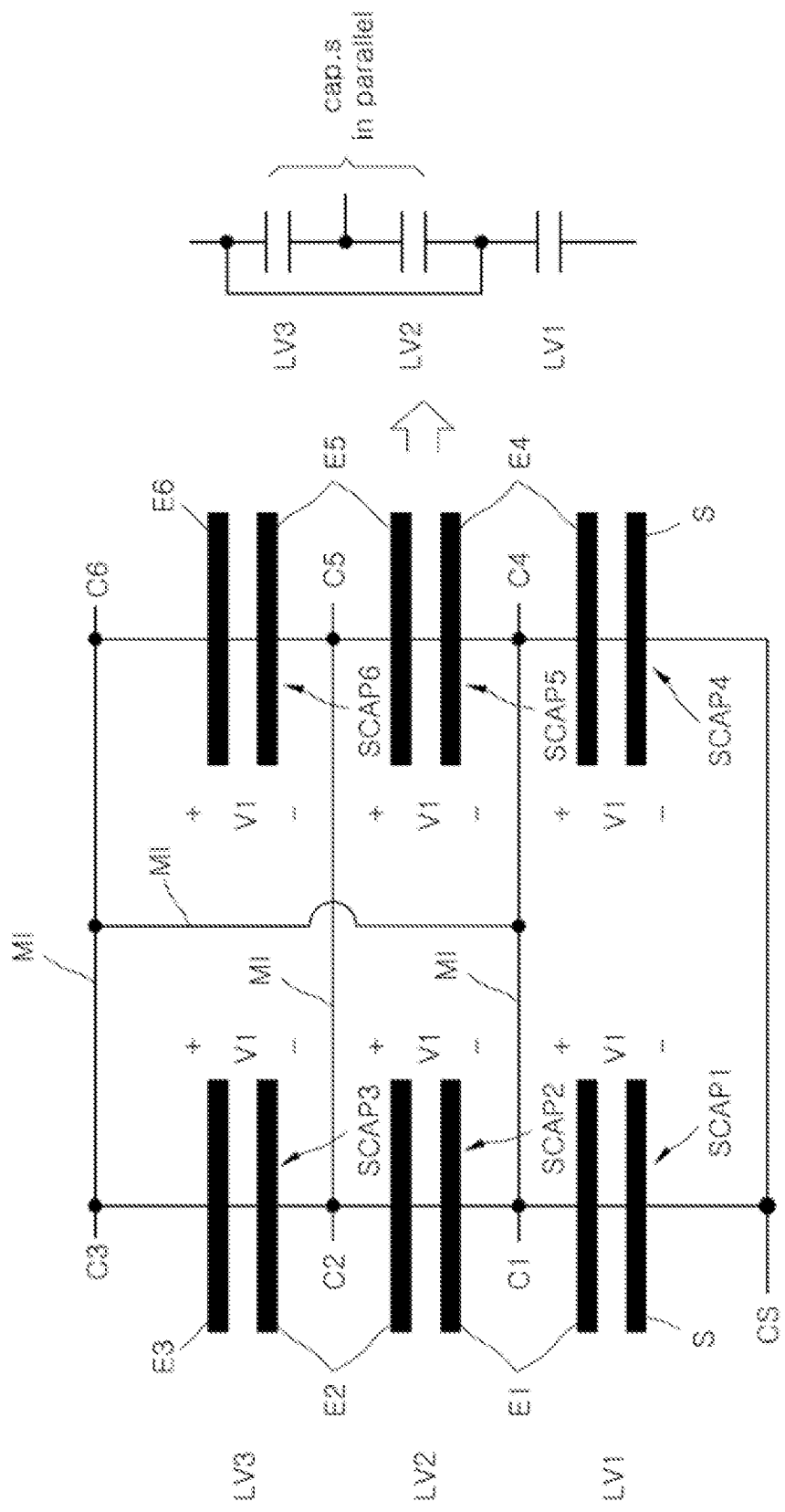
Figure 3F:
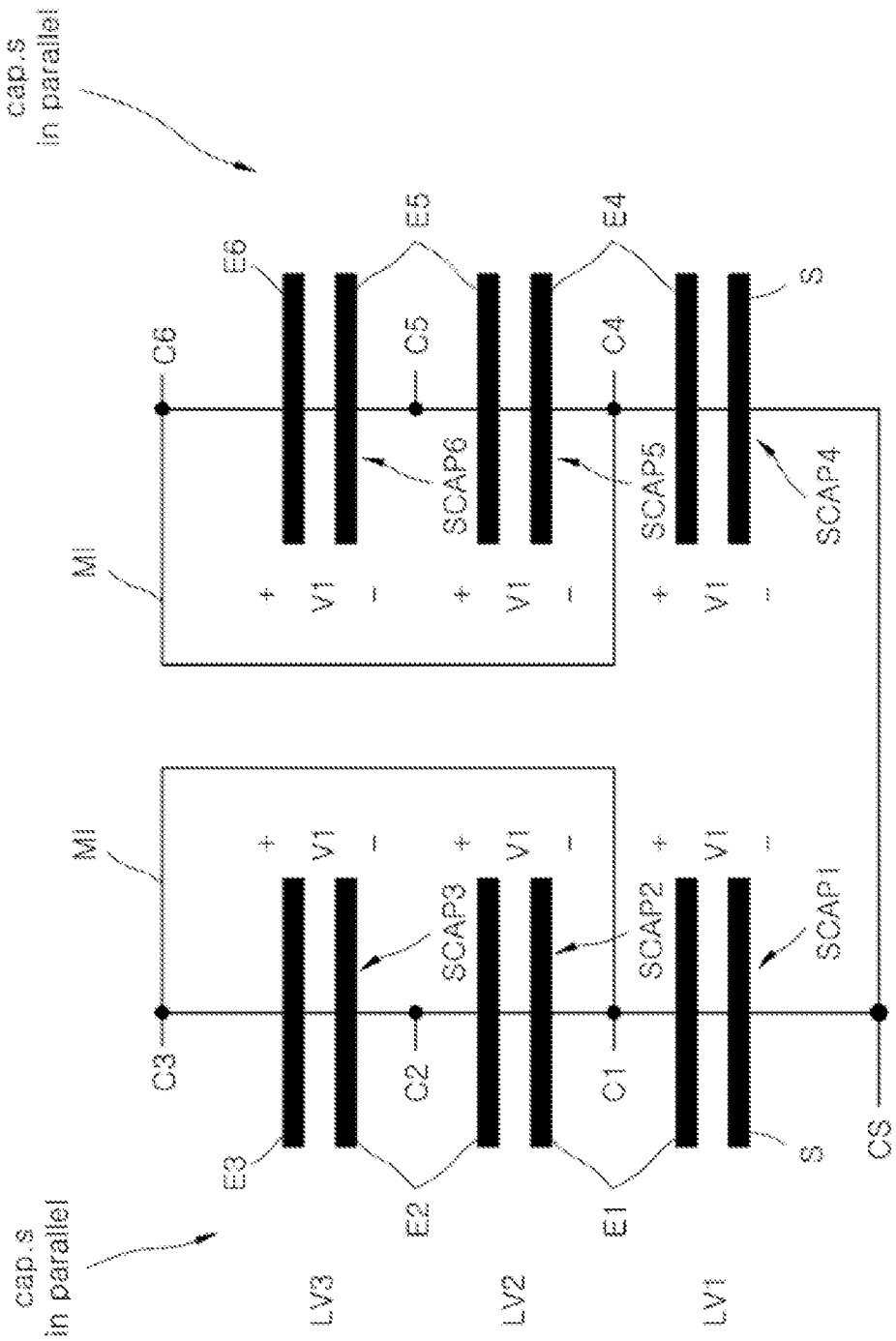
Figure 4A:
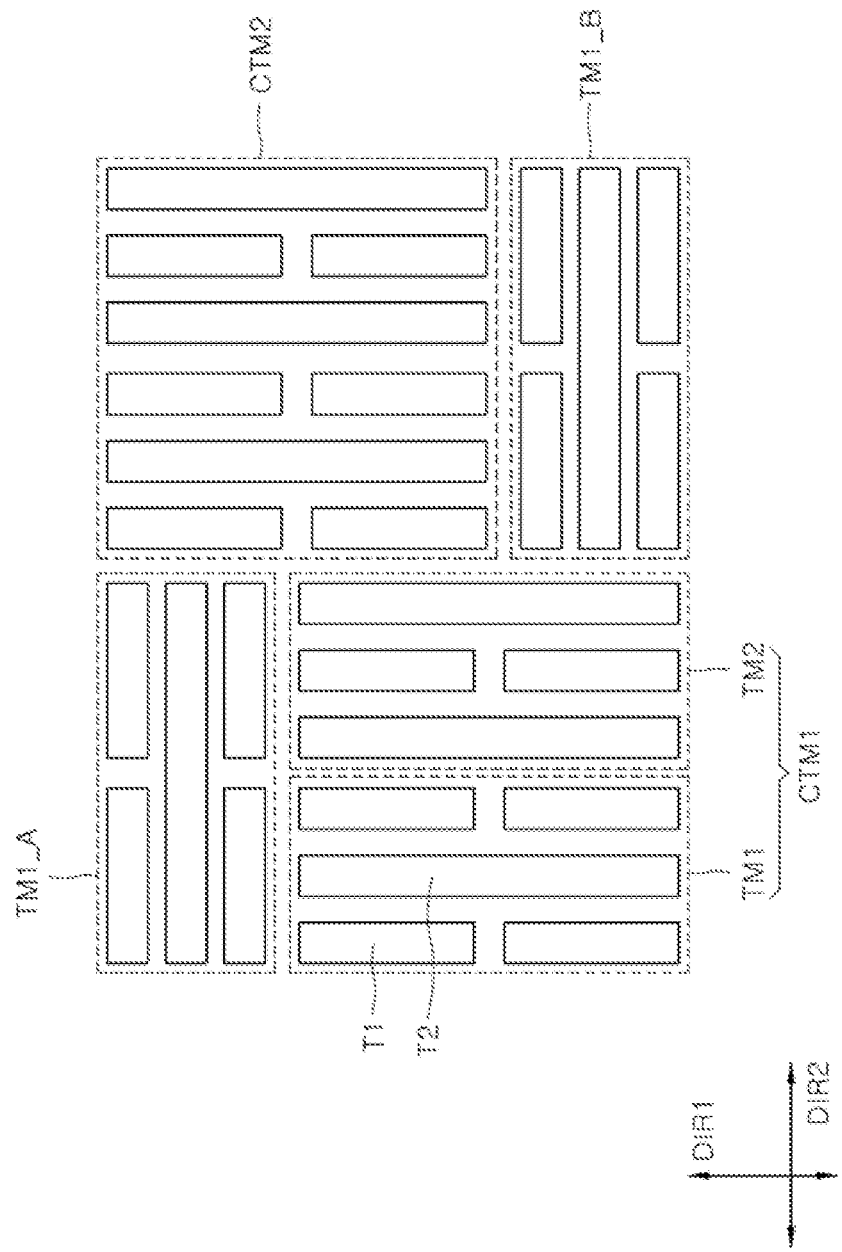
FIG. 4A and FIG. 4B are exemplary diagrams illustrating an arrangement of trenches in the semiconductor device according to an embodiment.
Figure 4B:
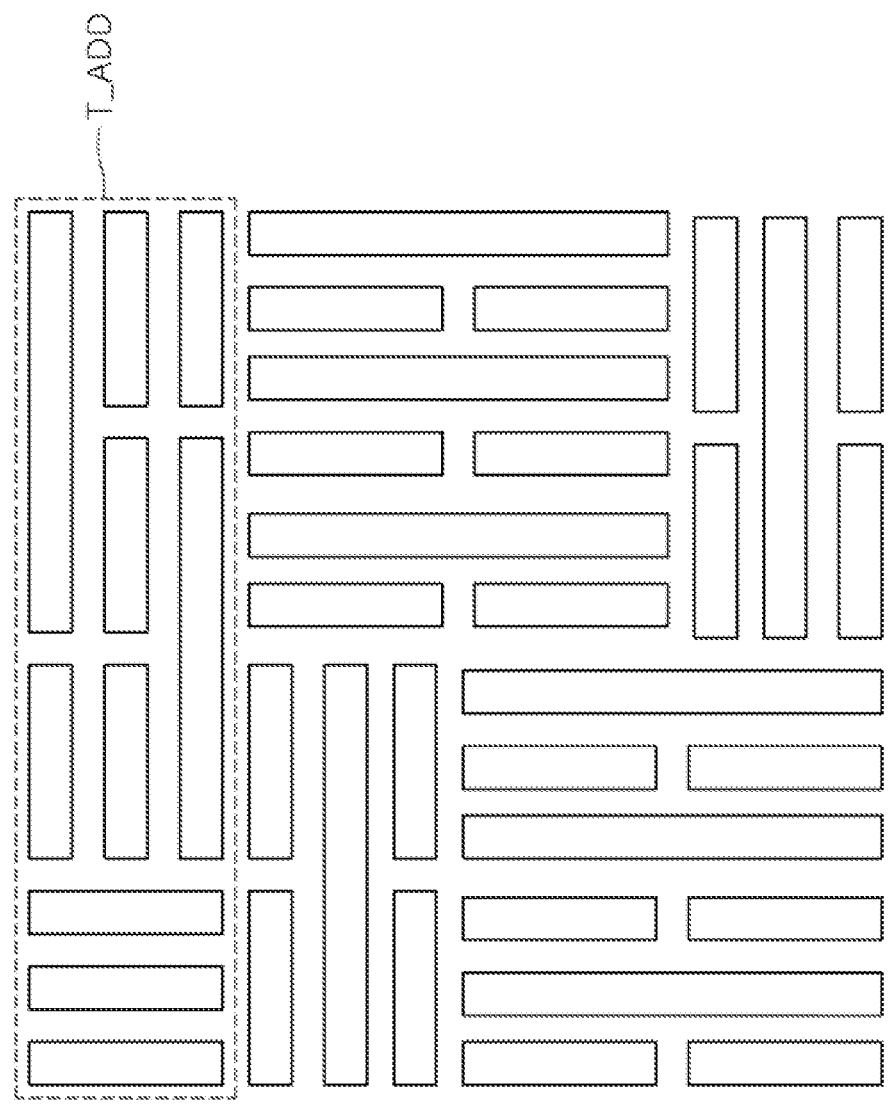
Figure 5A:
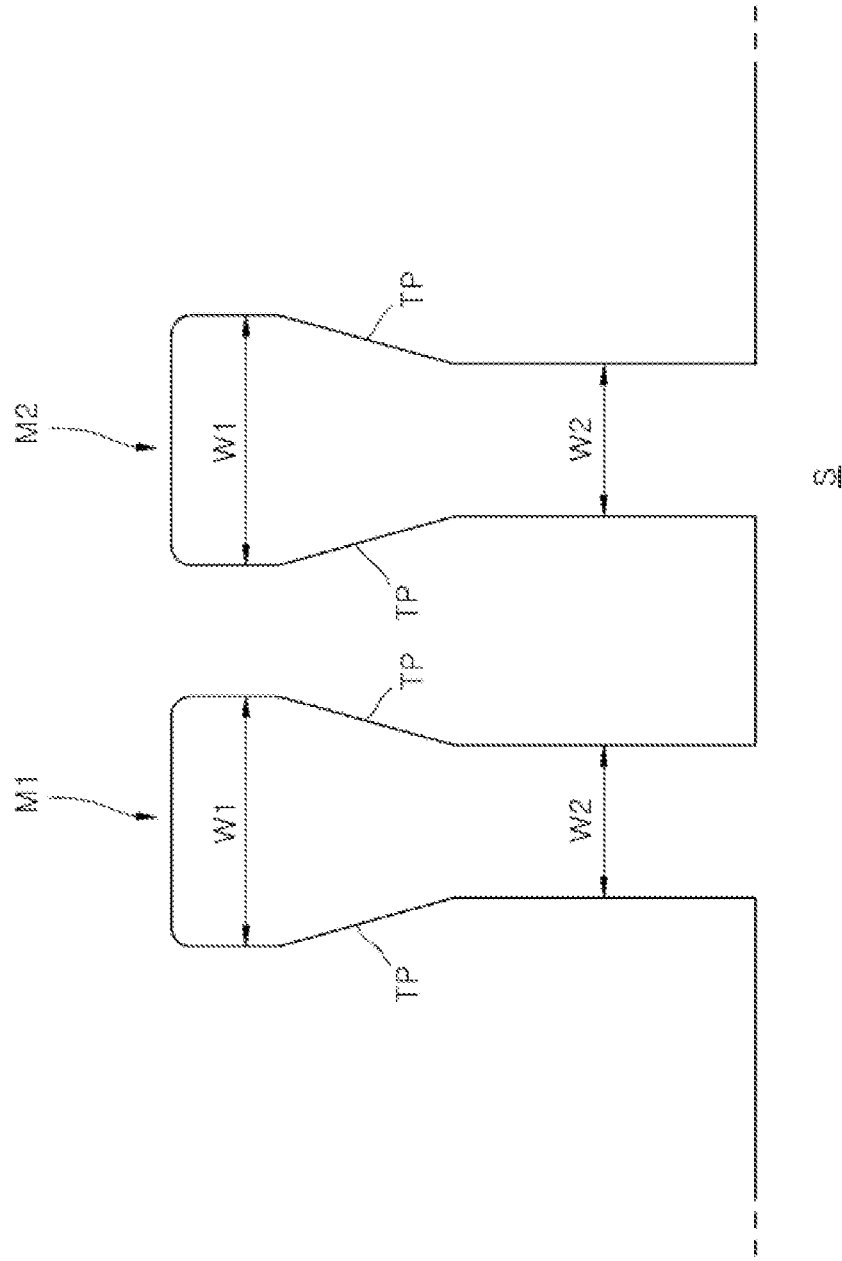
FIG. 5A and FIG. 5B are cross-sectional views illustrating a tapered portion and a void of a mesh structure in the semiconductor device according to an embodiment.
Figure 5B:
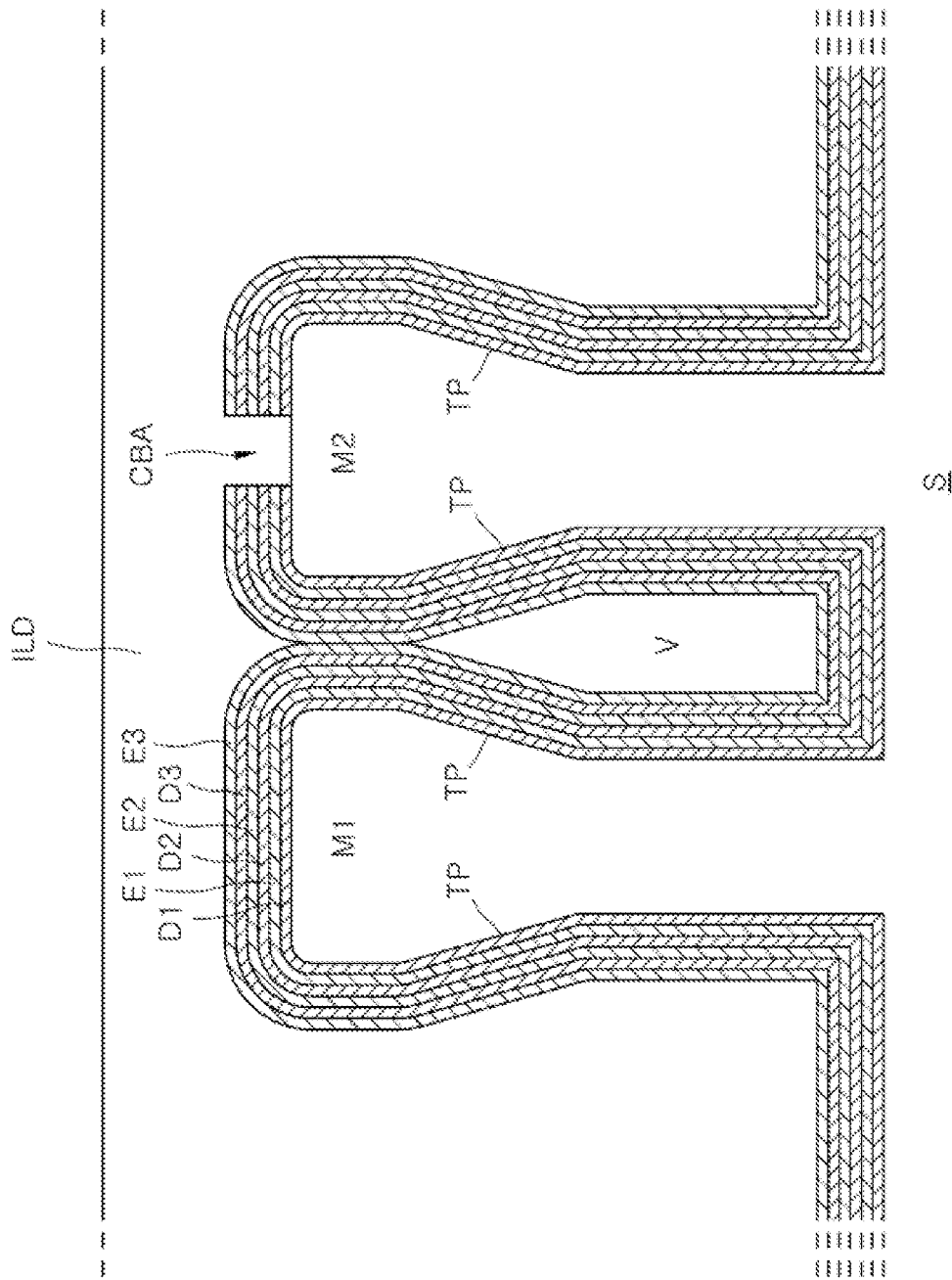

FIG. 1 is a cross-sectional view illustrating a capacitor structure in a semiconductor device according to an embodiment, FIG. 2 is a cross-sectional view illustrating first and second capacitor structures in the semiconductor device according to an embodiment, FIG. 3A to FIG. 3F show circuit diagrams illustrating connections of sub-capacitor structures according to an implementation method of an interconnection structure in the semiconductor device according to an embodiment, FIG. 4A and FIG. 4B are exemplary diagrams illustrating a trench arrangement in the semiconductor device according to an embodiment, and FIG. 5A and FIG. 5B are cross-sectional views illustrating a tapered portion and a void of a mesh structure in the semiconductor device according to an embodiment.

1. Capacitor Structure

Referring to FIG. 1, a capacitor structure CAP1 of the present embodiment may be defined as a structure including a trench T1 formed in a semiconductor substrate S, a plurality of electrode layers E1 to E3 disposed in the trench T1, the semiconductor substrate S, and one or more dielectric layers D1 to D3 disposed in an interlaced structure with the plurality of electrode layers E1 to E3.

The semiconductor substrate S may be an N-type silicon substrate, and when the semiconductor substrate S is highly doped with an N-type dopant (N++), the semiconductor substrate S itself may be formed as a ground electrode for the capacitor structure CAP1. The trench T1 formed in the semiconductor substrate S may correspond to a deep trench and may be formed with a high aspect ratio having a depth of 10 μm or 100 μm or more. Each of the electrode layers E1 to E3 may be formed of N-type (N+) doped polysilicon, but the present invention is not limited thereto and the electrode layers E1 to E3 may be formed of a metal material (such as copper or aluminum). Each of the dielectric layers D1 to D3 may be formed of a high-density dielectric or high-K dielectric material such as SiN, $BaTiO_3$, PZT, $Al_2O_3$, $Ta_2O_3$, or $HfO_2$.

Since the capacitor structure CAP1 is formed by stacking the plurality of electrode layers E1 to E3 and the one or more dielectric layers D1 to D3 in the interlaced structure, the capacitor structure CAP1 may be formed to include a plurality of sub-capacitor structures SCAP1 to SCAP3. FIG. 1 shows an example of the capacitor structure CAP1 formed by stacking three electrode layers E1 to E3 and three dielectric layers D1 to D3 in an interlaced structure. That is, the capacitor structure CAP1 of FIG. 1 has a structure in which the semiconductor substrate S, the first dielectric layer D1, the first electrode layer E1, the second dielectric layer D2, the second electrode layer E2, the third dielectric layer D3, and the third electrode layer E3 are stacked sequentially. The semiconductor substrate S and the first electrode layer E1 are insulated by the first dielectric layer D1, the first electrode layer E1 and the second electrode layer E2 are insulated by the second dielectric layer D2, and the second electrode layer E2 and the third electrode layer E3 are insulated by the third dielectric layer D3. To facilitate understanding of the embodiment, in the present embodiment, the capacitor structure CAP1 is described as including the three electrode layers E1 to E3 and the three dielectric layers D1 to D3.

The semiconductor substrate S, the first dielectric layer D1, and the first electrode layer E1 constitute the first sub-capacitor structure SCAP1 of the capacitor structure CAP1, the first electrode layer E1, the second dielectric layer D2, and the second electrode layer E2 constitute the second sub-capacitor structure SCAP2 of the capacitor structure CAP1, and the second electrode layer E2, the third dielectric layer D3, and the third electrode layer E3 constitute the third sub-capacitor structure SCAP3 of the capacitor structure CAP1. Since the semiconductor substrate S is grounded and a voltage is applied to the first to third electrode layers E1 to E3 through an interconnection structure which will be described below, the first to third sub-capacitor structures SCAP1 to SCAP3 may each operate as a capacitor. Hereinafter, for convenience of description, positions of the first to third sub-capacitor structures SCAP1 to SCAP3 in the stacked structure are represented as first to third levels LV1 to LV3.

2. Connection Blocking Area and Interconnection Structure

The semiconductor device of the present embodiment is formed to include a plurality of capacitor structures formed to be spaced apart from each other on the semiconductor substrate S. As shown in FIG. 2, two adjacent capacitor structures among the plurality of capacitor structures are defined as first and second capacitor structures CAP1 and CAP2, and the first and second capacitor structures CAP1 and CAP2 are formed to have the same stacked structure and formed of the same material. According to the example of FIGS. 1 and 2, the capacitor structures CAP1 and CAP2 are described as including three electrode layers E1 to E3 and E4 to E6 and three dielectric layers D1 to D3 and D4 to D6. For clear distinction of terms, the terms "first trench T1," "first to third dielectric layers D1 to D3," and "first to third electrode layers E1 to E3" are used for the first capacitor structure CAP1, and the terms "second trench T2," "fourth to sixth dielectric layers D4 to D6," and "fourth to sixth electrode layers E4 to E6" are used for the second capacitor structure CAP2. In addition, a protruding portion of the semiconductor substrate S, which is located between the first trench T1 of the first capacitor structure CAP1 and the second trench T2 of the second capacitor structure CAP2 (that is, the protruding portion of the semiconductor substrate S partitions the first and second trenches T1 and T2), is defined as a mesh structure MESH (to facilitate understanding of the embodiment, a tapered portion of the mesh structure MESH that will be described below is not shown in FIG. 2) Meanwhile, the first and second capacitor structures CAP1 and CAP2 share the semiconductor substrate S as a common ground electrode.

Thus, the semiconductor substrate S, the first dielectric layer D1, and the first electrode layer E1 constitute the first sub-capacitor structure SCAP1 of the first capacitor structure CAP1, the first electrode layer E1, the second dielectric layer D2, and the second electrode layer E2 constitute the second sub-capacitor structure SCAP2 of the first capacitor structure CAP1, and the second electrode layer E2, the third dielectric layer D3, and the third electrode layer E3 constitute the third sub-capacitor structure SCAP3 of the first capacitor structure CAP1.

Similarly, the semiconductor substrate S, the fourth dielectric layer D4, and the fourth electrode layer E4 constitute a fourth sub-capacitor structure SCAP4 of the second capacitor structure CAP2, the fourth electrode layer E4, the fifth dielectric layer D5, and the fifth electrode layer E5 constitute a fifth sub-capacitor structure SCAP5 of the second capacitor structure CAP2, and the fifth electrode layer E5, the sixth dielectric layer D6, and the sixth electrode layer E6 constitute a sixth sub-capacitor structure SCAP6 of the second capacitor structure CAP2.

As shown in FIG. 2, elements constituting the first capacitor structure CAP1 (that is, the first to third dielectric layers D1 to D3 and the first to third electrode layers E1 to E3), elements constituting the second capacitor structure CAP2 (that is, the fourth to sixth dielectric layers D4 to D6), and a connection blocking area CBA, which blocks connections between the fourth to sixth electrode layers E4 to E6, are formed between the first and second capacitor structures CAP1 and CAP2.

The connection blocking area CBA serves as an infrastructure for connecting a plurality of sub-capacitor structures selected from among the above-described first to sixth sub-capacitor structures SCAP1 to SCAP6 in parallel or operating each sub-capacitor structure as a single capacitor. Based on an integrated circuit (IC) in which the semiconductor device of the present embodiment is integrated, capacitance required for each IC may be different, and even in the same IC, a plurality of capacitances may be required for the operation of a corresponding IC according to an application in which the IC is applied or an IC to which a plurality of operating voltages are applied may also require a plurality of capacitances to operate the IC.

In order to expand applications of the IC, the present embodiment employs a structure for blocking connections between each element constituting the first capacitor structure CAP1 and each element constituting the second capacitor structure CAP2 instead of employing a structure in which the elements of the first and second capacitor structures CAP1 and CAP2 are interconnected. That is, due to the connection blocking area CBA, connections between the first and fourth electrode layers E1 and E4, between the second and fifth electrode layers E2 and E5, between the third and sixth electrode layers E3 and E6, between the first and fourth dielectric layers D1 and D4, between the second and fifth dielectric layers D2 and D5, and between the third and sixth dielectric layers D3 and D6 are blocked.

Regarding processes of the first and second capacitor structures CAP1 and CAP2, corresponding elements among the elements constituting the first capacitor structure CAP1 and the second capacitor structure CAP2 may be formed through the same semiconductor process. That is, in a state in which the connection blocking area CBA is masked, for the first and second trenches T1 and T2, a first process (the simultaneous formation of the first and fourth dielectric layers D1 and D4 according to dielectric layer deposition), a second process (the simultaneous formation of the first and fourth electrode layers E1 and E4 according to electrode layer deposition), a third process (the simultaneous formation of the second and fifth dielectric layers D2 and D5 according to dielectric layer deposition), a fourth process (the simultaneous formation of the second and fifth electrode layers E2 and E5 according to electrode layer deposition), a fifth process (the simultaneous formation of the third and sixth dielectric layers D3 and D6 according to dielectric layer deposition), and a sixth process (the simultaneous formation of the third and sixth electrode layers E3 and E6 according to electrode layer deposition) are performed sequentially so that the connection blocking area CBA may be formed, and simultaneously, the elements of the capacitor structures CAP1 and CAP2 may be formed. In addition, since the first and fourth dielectric layers D1 and D4 are simultaneously formed through the first process, the first and fourth dielectric layers D1 and D4 have the same first thickness, since the second and fifth dielectric layers D2 and D5 are simultaneously formed through the third process, the second and fifth dielectric layers D2 and D5 have the same second thickness, and since the third and sixth dielectric layers D3 and D6 are simultaneously formed through the fifth process, the third and sixth dielectric layers D3 and D6 have the same third thickness. The above-described first to third thicknesses constitute thickness profiles of the semiconductor device, and the thickness profiles (that is, values of the first to third thicknesses) may be defined in advance according to voltages applied to the first to sixth sub-capacitor structures SCAP1 to SCAP6. Due to the dielectric layers D1 to D6 having these thickness profiles, a plurality of voltages with different voltage values may be applied to the first and second capacitor structures.

In order to provide parallel connections between a plurality of sub-capacitor structures selected from among the first to sixth sub-capacitor structures SCAP1 to SCAP6 or to enable each of the plurality of selected sub-capacitor structures to serve as a single capacitor, an interconnection structure is formed to be connected to the semiconductor substrate S and the first to sixth electrode layers E1 to E6. To this end, the interconnection structure may include contacts CS and C1 to C6 connected to the semiconductor substrate S and the first to sixth electrode layers E1 to E6, and metal interconnections (MIs) for formation of parallel connections between the plurality of sub-capacitor structures (to clearly illustrate the configuration, the MIs are omitted from the drawings, and physical MIs may be implemented according to an electrode layer connected method according to FIG. 3) (when each sub-capacitor structure serves as a single capacitor, a structure in which each contact (and a contact pad (not shown) connected to the contact) is directly connected to a printed circuit board (PCB) integrated into an IC may be applied, and thus the MIs may be omitted).

As a connection method of the sub-capacitor structures by the interconnection structure, i) a method of using each sub-capacitor structure as a single capacitor (hereinafter referred to as a single connection method), ii) a method of providing a plurality of parallel connection structures for the sub-capacitor structure (hereinafter referred to as a parallel connection method), and iii) a method of mixing the parallel connection method and the single connection method for the sub-capacitor structures (hereinafter referred to as a mixed connection method) may be considered. Each connection method will be described in detail.

① Single Connection Method

As mentioned above, in the case of the single connection method, the structure in which each contact (and the contact pad connected to the contact) is directly connected to a PCB integrated into an IC may be applied, and thus the MIs may be omitted. Thus, the interconnection structure may include the contacts CS and C1 to C6 connected to the semiconductor substrate S and the first to sixth electrode layers E1 to E6, and contact pads connected to the contacts CS and C1 to C6.

Meanwhile, the same voltage V1 may be applied to the first to sixth sub-capacitor structures SCAP1 to SCAP6 (see FIG. 3A). In this case, all the first to sixth dielectric layers D1 to D6 may be formed to have the same thickness.

Different voltages V1 to V3 may be applied to the first to sixth sub-capacitor structures SCAP1 to SCAP6 (see FIG. 3B). For example, a first voltage V1 (e.g., 1.2 V) may be applied to the first and fourth sub-capacitor structures SCAP1 and SCAP4, a second voltage V2 (e.g., 1.8 V), which is different from the first voltage V1, may be applied to the second and fifth capacitor structures SCAP2 and SCAP5, and a third voltage V3 (e.g., 3.3 V), which is different from the first and second voltages V1 and V2, may be applied to the third and sixth capacitor structures SCAP3 and SCAP6. Thus, the first and fourth dielectric layers D1 and D4 may each be formed to have a first thickness with a withstanding voltage with respect to the first voltage V1, the second and fifth dielectric layers D2 and D5 may each be formed to have a second thickness (>the first thickness) with a withstanding voltage with respect to the second voltage V2, and the third and sixth dielectric layers D3 and D6 may each be formed to have a third thickness (>the second thickness) with a withstanding voltage with respect to the third voltage V3. The thickness profiles of the dielectric layers according to the voltage profiles are commonly applied to the capacitor structure described in the present specification.

② Parallel Connection Method

The interconnection structure may include a contact-metal structure for providing a parallel connection between the first and fourth sub-capacitor structures SCAP1 and SCAP4, a parallel connection between the second and fifth sub-capacitor structures SCAP2 and SCAP5, and a parallel connection between the third and sixth sub-capacitor structures SCAP3 and SCAP6. This may be implemented through a contact-metal connection between the first and fourth electrode layers E1 and E4, a contact-metal connection between the second and fifth electrode layers E2 and E5, and a contact-metal connection between the third and sixth electrode layers E3 and E6. Like the single connection method, the same voltage V1 may be applied to the first to sixth sub-capacitor structures SCAP1 to SCAP6 (see FIG. 3C) or the different voltages V1 to V3 may be applied thereto (see FIG. 3D). When compared to the single connection method, in the parallel connection method, capacitance at each of the first to third levels LV1 to LV3 may increase.

Meanwhile, as shown in FIG. 3E, when the same voltage V1 is applied to the first to sixth sub-capacitor structures SCAP1 to SCAP6, a contact-metal connection structure for connecting all of the first and fourth electrode layers E1 and E4 and the third and sixth electrode layers E3 and E6 may be employed. In this case, a structure in which a capacitor according to the parallel connection between the second and fifth sub-capacitor structures SCAP2 and SCAP5 and a capacitor according to the parallel connection between the third and sixth sub-capacitor structures SCAP3 and SCAP6 are connected in parallel again is provided so that capacitances at the second and third levels LV2 and LV3 may further increase.

③ Mixed Connection Method

The interconnection structure may include a contact-metal structure for providing parallel connections between N sub-capacitor structures selected from among the first to sixth sub-capacitor structures SCAP1 to SCAP6 and enabling each of the remaining M sub-capacitor structures to serve as a single capacitor (here, N and M are natural numbers, N≥2, and N+M=6). FIG. 3F shows an example in which the second and third sub-capacitor structures SCAP2 and SCAP3 are connected in parallel, the fifth and sixth sub-capacitor structures SCAP5 and SCAP6 are connected in parallel, and each of the first and fourth sub-capacitor structures SCAP1 and SCAP4 serves as a single capacitor (i.e., N=4 and M=2).

By employing the above-described connection blocking area CBA and the interconnection structure, application expandability to an IC can be secured in the semiconductor device in which the plurality of capacitor structures are provided.

3. Trench Arrangement

As described above, the trench of the present embodiment may be implemented as a deep trench, and as stress is applied to the semiconductor substrate S due to a high aspect ratio of the deep trench, after the trench is etched in the semiconductor substrate S, a sticking problem in which a sidewall of the semiconductor substrate S forming the trench collapses, and warpage of the semiconductor substrate S due to a deep trench structure and a substrate crack problem caused by the warpage may occur.

In order to solve the above problems, in the present embodiment, a trench arrangement as shown in FIG. 4 is employed (in order to facilitate understanding of the embodiment, only the trench is shown in FIG. 4 and the dielectric layers and the electrode layers are omitted).

As shown in FIG. 4A, a first trench T1 may have a first length and a second trench T2 may have a second length that is greater than the first length on the semiconductor substrate S based on a first direction DIR1 (the first trench T1 may correspond to a trench constituting the first capacitor structure CAP1, and the second trench T2 may correspond to a trench constituting the second capacitor structure CAP2; thus, a space between the first and second trenches T1 and T2 may correspond to the above-described connection blocking area CBA).

In this case, the first and second trenches T1 and T2 are alternately disposed in at least one portion of the semiconductor substrate S based on the first direction DIR1 or a second direction DIR2 so that an arrangement structure of the first and second trenches T1 and T2 on the semiconductor substrate S may have irregularity. A mutually alternating arrangement of the first and second trenches T1 and T2 in the first direction DIR1 may be, for example, an arrangement structure such as "TM1_A" or "TM1_B" of FIG. 4A, and a mutually alternating arrangement of the first and second trenches T1 and T2 in the second direction DIR2 may be, for example, an arrangement structure such as "TM1" or "TM2" of FIG. 4A. These arrangement structures of the first and second trenches T1 and T2 secure irregularity of all or a part of the trench structure on the semiconductor substrate S.

Based on the first and second trenches T1 and T2, first and second trench modules TM1 and TM2 may be provided in the present embodiment.

The first trench module TM1 may include a second trench T2 and first trenches T1 disposed on both sides of the second trench T2 based on the second direction DIR2 perpendicular to the first direction DIR1. As shown in FIG. 4A, in the first trench module TM1, two first trenches T1 may be disposed on each side of one second trench T2 in the first direction DIR1 and are formed to be edge-aligned based on the first direction DIR1. That is, since trenches having different lengths are irregularly disposed based on the second direction DIR2, stress applied to the semiconductor substrate S is relieved.

The second trench module TM2 may include first trenches T1 and second trenches T2 disposed at both sides of the first trenches T1 based on the second direction DIR2. As shown in FIG. 4A, in the second trench module TM2, one second trench T2 disposed in the first direction DIR1 may be disposed at each side of two first trenches T1 and is formed to be edge-aligned based on the first direction DIR1. That is, since trenches having different lengths are irregularly disposed based on the second direction DIR2, stress applied to the semiconductor substrate S is reduced.

The first trench module TM1 and the second trench module TM2 may be disposed adjacent to each other based on the second direction DIR2, and when the first trench module TM1 and the second trench module TM2, which are disposed to be adjacent, are defined as a complex trench module CTM1, a first trench module may be additionally disposed on one side of the complex trench module CTM1 based on the first direction DIR1 or the second direction DIR2 (in FIG. 4A, a first trench module additionally disposed on one side (upper side) of the complex trench module CTM1 based on the first direction DIR1 is represented as "TM1_A," and a first trench module additionally disposed on one side (right side) of the complex trench module CTM1 based on the second direction DIR2 is represented as "TM1_B").

In this case, a length direction of each of the additionally disposed first trench modules TM1_A and TM1_B may be the second direction DIR2. Thus, the length direction of each trench constituting the complex trench module CTM1 (in the first direction DIR1 in FIG. 4A) and the length directions of the additionally disposed first trench modules TM1_A and TM1_B (in the second direction DIR2 in FIG. 4A) are formed perpendicular to each other so that stress applied to the semiconductor substrate S may be offset due to each trench.

In addition, as described above, the first and second trenches T1 and T2 are alternately disposed in at least one portion of the semiconductor substrate S based on the first direction DIR1 or the second direction DIR2 so that an arrangement structure of the first and second trenches T1 and T2 on the semiconductor substrate S may have irregularity. The "irregularity" of the trench structure may be asymmetry of the trench structure at the level of the "complex trench modules" CTM1 and CTM2 (transverse asymmetry, longitudinal asymmetry, and rotational asymmetry). Based on FIG. 4A, the complex trench module CTM1 has asymmetry with respect to the second direction (for example, even when the complex trench module CTM1 is inverted in the second direction based on the first direction as a rotation axis, the complex trench module CTM1 "before the inversion" and the complex trench module CTM1 "after the inversion" do not coincide with each other). In addition, based on FIG. 4A, the complex trench module CTM1 has rotational asymmetry (for example, even when the complex trench module CTM1 is rotated, the complex trench module CTM1 "before the rotation" and the complex trench module CTM1 "after the rotation" do not coincide with each other). Due to the irregularity and asymmetry of the complex trench module CTM1, stress applied to the semiconductor substrate S can be relieved, and since the complex trench module CTM1 has the irregularity and asymmetry, the overall trench structure formed on the semiconductor substrate S also has irregularity and asymmetry.

As shown in FIG. 4A, to enable the overall trench arrangement to be rectangularized and patterned, two complex trench modules CTM1 and CTM2 and two additional first trench modules TM1_A and TM1_B may be formed. Alternatively, as shown in FIG. 4B, to enable the overall trench arrangement to be squared and patterned, in addition to the trench arrangement of FIG. 4A, a plurality of additional trenches T_ADD may be provided.

4. Tapered Portion of Mesh Structure

Hereinbefore, the present embodiment has been described by focusing on the structure in which the first and second capacitor structures CAP1 and CAP2 are partitioned based on one mesh structure. Hereinafter, in order to describe a "tapered portion" employed in the present embodiment in detail, the present embodiment will be described by focusing on a structure in which two mesh structures (represented as first and second mesh structures M1 and M2) are partitioned based on one trench. Of course, the configuration described below may be applied together with the above-described configuration of the present embodiment.

In the case of a trench capacitor, stress due to tensile and compressive stress is applied to the semiconductor substrate S due to a difference between a thermal expansion coefficient of the semiconductor substrate S and thermal expansion coefficients of the dielectric layer and the electrode layer, which are disposed in the trench, so that a cracking problem occurs in the semiconductor substrate S. In order to solve the above problem, in the present embodiment, by forming a void V corresponding to a free space inside the trench, a space is formed to dissipate tensile and compressive stress caused by the difference between the thermal expansion coefficient of the semiconductor substrate S and the thermal expansion coefficients of the dielectric layer and the electrode layer, which are disposed inside the trench (that is, the void V serves as a component for stress relief).

Specifically, as shown in FIG. 5A, the first and second mesh structures M1 and M2 of the present embodiment may include, at least partially, tapered portions TP, each having a width that becomes smaller toward lower portions of the first and second mesh structures M1 and M2, and as shown in FIG. 5B, the void V formed inside the trench may be formed to have a width profile corresponding to the tapered portion TP. That is, the first and second mesh structures M1 and M2 are each formed to have an upper end with a first width W1 and a lower end with a second width W2 that is smaller than the first width W1 based on the tapered portion TP. Thus, as shown in FIG. 5B, the trench disposed between the first and second mesh structures M1 and M2 is formed to have an upper end with a width that is smaller than that of a lower end based on the tapered portion TP.

Therefore, as shown in FIG. 5B, when the first dielectric layer D1, the first electrode layer E1, the second dielectric layer D2, the second electrode layer E2, the third dielectric layer D3, and the third electrode layer E3 are sequentially deposited in the trench, due to large widths (i.e., the above-described first widths W1) of the upper ends of the first and second mesh structures M1 and M2, an upper opening of the trench is closed by a contact of the third electrode layer E3. Accordingly, the void V has a predetermined width at the lower end of the tapered portion TP, a width of the void V in the tapered portion TP is decreased in response to an inclination of the tapered portion TP, and the void V is closed at a contact point of the third electrode layer E3. Therefore, the void V is formed as a free space formed by being closed by only the third electrode layer E3 (i.e., the outermost electrode layer) among the plurality of electrode layers E1 to E3 disposed in the trench.

In addition, as shown in FIG. 5B, the void V is formed in a structure closed by portions of the outermost electrode layer E3 in contact with each other at an upper side of the tapered portion TP. Thus, the void V may be formed independently from an inter-layer dielectric (ILD) (i.e., an insulating layer at a contact level below the metal line MI) applied to the semiconductor device. That is, since a space (i.e., the void V) for relieving the stress applied to the semiconductor substrate S is formed, a crack problem of the semiconductor substrate S can be solved. In addition, without an additional process of depositing an ILD inside the trench to form the void V, the void V may be formed naturally by the tapered portion TP using only the deposition process of the dielectric layer and the electrode layer, which is necessary in the manufacturing process of the semiconductor device. Thus, simplification and convenience in the manufacturing process can be secured.

As described above, in accordance with a semiconductor device (for example, an integrated circuit (IC)) having a plurality of trench capacitors according to the invention, the usability of trench capacitors can be expanded, and sticking problems, warpage problems, and substrate crack problems, which may be caused by stress applied to semiconductor substrates in a trench capacitor processing process, can be removed.

While the present invention has been described with reference to embodiments shown in the drawings, these embodiments are merely illustrative and it should be understood that various modifications and equivalent other embodiments can be derived by those skilled in the art on the basis of the embodiments. Therefore, the true technical scope of the present invention should be defined by the appended claims.

What is claimed is:

1. A semiconductor device comprising a first capacitor structure and a second capacitor structure formed to be spaced apart from each other on a semiconductor substrate,
    wherein the first capacitor structure includes a first trench formed in the semiconductor substrate, a first electrode layer, a second electrode layer, and a third electrode layer disposed in the first trench, and a first dielectric layer, a second dielectric layer, and a third dielectric layer disposed in an interlaced structure with the semiconductor substrate and the first to third electrode layers, the second capacitor structure includes a second trench formed in the semiconductor substrate, a fourth electrode layer, a fifth electrode layer, and a sixth electrode layer disposed in the second trench, and a fourth dielectric layer, a fifth dielectric layer, and a sixth dielectric layer disposed in an interlaced structure with the semiconductor substrate and the fourth to sixth electrode layers, and a connection blocking area formed between the first and second capacitor structures to block connections between elements constituting the first capacitor structure and elements constituting the second capacitor structure are blocked, wherein:

the semiconductor substrate, the first dielectric layer, and the first electrode layer constitute a first sub-capacitor structure of the first capacitor structure, the first electrode layer, the second dielectric layer, and the second electrode layer constitute a second sub-capacitor structure of the first capacitor structure, and the second electrode layer, the third dielectric layer, and the third electrode layer constitute a third sub-capacitor structure of the first capacitor structure;

the semiconductor substrate, the fourth dielectric layer, and the fourth electrode layer constitute a fourth sub-capacitor structure of the second capacitor structure, the fourth electrode layer, the fifth dielectric layer, and the fifth electrode layer constitute a fifth sub-capacitor structure of the second capacitor structure, and the fifth electrode layer, the sixth dielectric layer, and the sixth electrode layer constitute a sixth sub-capacitor structure of the second capacitor structure; and the semiconductor device further includes an interconnection structure connected to the semiconductor substrate and the first to sixth electrode layers in order to provide parallel connections between a plurality of sub-capacitor structures selected from among the first to sixth sub-capacitor structures or allow each sub-capacitor structure to serve as a single capacitor, wherein the interconnection structure includes a contact-metal structure configured to provide a parallel connection between the first and fourth sub-capacitor structures, a parallel connection between the second and fifth sub-capacitor structures, and a parallel connection between the third and sixth sub-capacitor structures.

2. The semiconductor device of claim 1, wherein corresponding elements among the elements constituting the first capacitor structure and the elements constituting the second capacitor structure are formed through the same semiconductor process.

3. The semiconductor device of claim 1, wherein each of the first to sixth dielectric layers has a thickness profile corresponding to a predefined voltage profile according to a voltage applied to each of the first to sixth sub-capacitor structures so that a plurality of voltages with different voltage values are applied to the first and second capacitor structures.

4. The semiconductor device of claim 1, wherein the semiconductor substrate itself is highly doped to form a common ground electrode for the first and second capacitor structures.

5. A semiconductor device, comprising a first capacitor structure and a second capacitor structure formed to be spaced apart from each other on a semiconductor substrate, wherein the first capacitor structure includes a first trench formed in the semiconductor substrate, a first electrode layer, a second electrode layer, and a third electrode layer disposed in the first trench, and a first dielectric layer, a second dielectric layer, and a third dielectric layer disposed in an interlaced structure with the semiconductor substrate and the first to third electrode layers, the second capacitor structure includes a second trench formed in the semiconductor substrate, a fourth electrode layer, a fifth electrode layer, and a sixth electrode layer disposed in the second trench, and a fourth dielectric layer, a fifth dielectric layer, and a sixth dielectric layer disposed in an interlaced structure with the semiconductor substrate and the fourth to sixth electrode layers, and a connection blocking area formed between the first and second capacitor structures to block connections between elements constituting the first capacitor structure and elements constituting the second capacitor structure are blocked, wherein:

the semiconductor substrate, the first dielectric layer, and the first electrode layer constitute a first sub-capacitor structure of the first capacitor structure, the first electrode layer, the second dielectric layer, and the second electrode layer constitute a second sub-capacitor structure of the first capacitor structure, and the second electrode layer, the third dielectric layer, and the third electrode layer constitute a third sub-capacitor structure of the first capacitor structure;

the semiconductor substrate, the fourth dielectric layer, and the fourth electrode layer constitute a fourth sub-capacitor structure of the second capacitor structure, the fourth electrode layer, the fifth dielectric layer, and the fifth electrode layer constitute a fifth sub-capacitor structure of the second capacitor structure, and the fifth electrode layer, the sixth dielectric layer, and the sixth electrode layer constitute a sixth sub-capacitor structure of the second capacitor structure; and the semiconductor device further includes an interconnection structure connected to the semiconductor substrate and the first to sixth electrode layers in order to provide parallel connections between a plurality of sub-capacitor structures selected from among the first to sixth sub-capacitor structures or allow each sub-capacitor structure to serve as a single capacitor, wherein the interconnection structure includes a contact-metal structure configured to provide parallel connections between N sub-capacitor structures selected from among the first to sixth sub-capacitor structures and allow each of the remaining M sub-capacitor structures to serve as a single capacitor (N and M are natural numbers, N≥2, and N+M=6).

6. The semiconductor device of claim 5, wherein each of the first to sixth dielectric layers has a thickness profile corresponding to a predefined voltage profile according to a voltage applied to each of the first to sixth sub-capacitor structures so that a plurality of voltages with different voltage values are applied to the first and second capacitor structures.

7. The semiconductor device of claim 5, wherein the semiconductor substrate itself is highly doped to form a common ground electrode for the first and second capacitor structures.

8. A semiconductor device, comprising a first capacitor structure and a second capacitor structure formed to be spaced apart from each other on a semiconductor substrate, wherein the first capacitor structure includes a first trench formed in the semiconductor substrate, a first electrode layer, a second electrode layer, and a third electrode layer disposed in the first trench, and a first dielectric layer, a second dielectric layer, and a third dielectric layer disposed in an interlaced structure with the semiconductor substrate and the first to third electrode layers, the second capacitor structure includes a second trench formed in the semiconductor substrate, a fourth electrode layer, a fifth electrode layer, and a sixth electrode layer disposed in the second trench, and a fourth dielectric layer, a fifth dielectric layer, and a sixth dielectric layer disposed in an interlaced structure with the semiconductor substrate and the fourth to sixth electrode layers, and a connection blocking area formed between the first and second capacitor structures to block connections between elements constituting the first capacitor structure and elements constituting the second capacitor structure are blocked, wherein the first trench has a first length, and the second trench has a second length that is greater than the first length based on a first direction on the semiconductor substrate, wherein the semiconductor device further comprises a first trench module, wherein the first trench module includes the second trench and the first trench disposed at each of two sides of the second trench based on a second direction perpendicular to the first direction.

9. The semiconductor device of claim 8, wherein the first and second trenches are alternately disposed in at least one portion of the semiconductor substrate based on the first direction or the second direction so that an arrangement structure of the first and second trenches in the semiconductor substrate has irregularity.

10. The semiconductor device of claim 8, further comprising a second trench module, wherein the second trench module includes the first trench and the second trench disposed at each of two sides of the first trench based on the second direction.

11. The semiconductor device of claim 10, wherein the first trench module and the second trench module are disposed adjacent to each other in the second direction, and when the adjacently disposed first trench module and second trench module are defined as a complex trench module, the first trench module is additionally disposed on one side of the complex trench module based on the first direction or the second direction, and a length direction of the additionally disposed first trench module is the second direction.

12. A semiconductor device comprising a first mesh structure and a second mesh structure which are partitioned by a trench formed in a semiconductor substrate, wherein a plurality of electrode layers and one or more dielectric layers disposed in an interlaced structure with the semiconductor substrate and the plurality of electrode layers are disposed in the trench, and the first and second mesh structures include, at least partially, tapered portions, each having a width which becomes smaller toward lower portions of the first and second mesh structures, wherein a void for stress relief with a width profile corresponding to the tapered portion is formed in the trench in which the plurality of electrode layers and the one or more dielectric layers are stacked, and wherein the void is a free space formed by being closed by only an outermost electrode layer among the plurality of electrode layers disposed in the trench.

13. The semiconductor device of claim 12, wherein the outermost electrode layer is disposed along a bottom surface, a first sidewall, and a second sidewall of the trench, and the outermost electrode layer disposed along the first sidewall and the outermost electrode layer disposed along the second sidewall are brought into contact with each other at an upper side of the tapered portion due to the tapered portion, and thus an upper opening of the trench is closed to form the void.

14. The semiconductor device of claim 13, wherein the void is formed independently from an inter-layer dielectric (ILD) applied to the semiconductor device by portions of the outermost electrode layer in contact with each other at the upper side of the tapered portion.

* * * * *